United States Patent [19]

Kraft

[11] 3,837,936

[45] Sept. 24, 1974

[54] PLANAR DIFFUSION METHOD

[75] Inventor: Wolfgang Kraft, Freiburg im Breisgau, Germany

[73] Assignee: ITT Industries, Inc., New York, N.Y.

[22] Filed: Oct. 18, 1972

[21] Appl. No.: 298,724

[30] Foreign Application Priority Data

Nov. 20, 1971 Germany ........................... 2157633

[52] U.S. Cl. ................................ 148/187, 317/235

[51] Int. Cl. ............................................ H01l 7/44

[58] Field of Search ............. 148/1.5, 187; 317/235

[56] References Cited

UNITED STATES PATENTS

| | | | |
|---|---|---|---|
| 3,497,407 | 2/1970 | Esch et al. | 148/1.5 X |
| 3,542,551 | 11/1970 | Rice | 148/1.5 UX |
| 3,560,278 | 2/1971 | Sanera | 148/187 |
| 3,658,610 | 4/1972 | Arita et al. | 148/1.5 X |

FOREIGN PATENTS OR APPLICATIONS

| | | | |
|---|---|---|---|
| 1,177,320 | 1/1970 | Great Britain | 317/235 |

OTHER PUBLICATIONS

"Masking Process for Base and Isolation Diffusion," Berger et al., IBM Tech. Disclosure Bull. Vol. 14, No. 5, Oct. 1971, pp. 1612–1613.

*Primary Examiner*—L. Dewayne Rutledge
*Assistant Examiner*—J. M. Davis
*Attorney, Agent, or Firm*—John T. O'Halloran; Menotti J. Lombardi, Jr.; Vincent Ingrassia

[57] ABSTRACT

This invention relates to a method of producing diffusion zones in integrated circuits. A master diffusion mask contains all openings for emitter, base and insulation diffusion. The openings in the master mask are closed or opened, depending on the diffusion step being performed, by means of a masking layer of a material which is easier to etch than the master mask.

4 Claims, 13 Drawing Figures

PATENTED SEP 24 1974 3,837,936

SHEET 1 OF 3

PLANAR DIFFUSION METHOD

BACKGROUND OF THE INVENTION

This invention relates to a method of producing diffusion zones in integrated circuits, and more particularly to the use of a master diffusion mask containing all openings for emitter, base and insulation diffusion. It is known, for example, from the journal "Scientia Electrica," Vol. (1964), pp. 115 to 119, to produce the zones of the elements of the monolithic integrated circuit by way of four successive planar processes, each consisting of a photolithographic process for producing openings in an insulating layer producing one diffusion masking, and of a subsequently following planar diffusion process. These planar processes relate to the planar diffusion of (1) semiconductive layers, so-called buried layers, which are diffused into the surface side of a plate-shaped semiconductor body to be provided with a monocrystalline semiconductive layer, (2) insulating zones serving the electrical separation of the semiconductor components, (3) base zones and (4) third zones, in particular, the emitter zones and the collector contact zones.

For each of the photolithographic processes subsequently required upon a planar diffusion process, for manufacturing the diffusion openings for a subsequently following further planar diffusion process, there is required a careful alignment of the necessary photo masking with the pattern of the structure to be diffused. However, since aligning and photomasking errors cannot be avoided completely, minimum spacings, so-called allowances have to be adhered to when designing the structures. Since these allowances are greater the more photolithographic processes are required, efforts are made to see that, if possible, the above-mentioned four planar processes are sufficient for the diffusion of all zones for all components of the integrated circuit to be manufactured. Thus, for example, together with the planar process for manufacturing the emitter zone, there is manufactured additionally, as a third zone, the collector contact zone. The photomasking for the emitter zones, accordingly, comprises additionally the structure for the collector contact zones. In the same way, for example, there are also manufactured simultaneously the zones of integrated capacitances and integrated resistances in the emitter zone planar process and the base zone planar process.

SUMMARY OF THE INVENTION

It is an object of the present invention to provide a method of producing diffusion zones wherein the allowances are reduced to a minimum and, consequently, to enable the manufacture on a plate-shaped semiconductor body of a plurality of monolithic integrated circuits having the closest spacings between zones and very small dimensions.

The invention, first of all, proceeds from the generally permissible condition that in the planar process for manufacturing the highly doped semiconductive layer placed at the interface between the plate-shaped semiconductor body and the surface layers deposited thereon mostly in an epitaxial manner, no extreme accuracy demands are required.

In order to enable a better understanding, and to simplify the description, the invention will now be referred to the manufacture of a monolithic integrated solid-state circuit. Of course, in manufacture, it is of advantage to produce a plurality of such integrated circuits of the same kind on one plate-shaped semiconductor body, as is generally the custom.

According to a broad aspect of the invention, there is provided an improved method for the planar diffusion of zones of a monolithic integrated circuit, wherein a monocrystalline surface layer of a semiconductive material of one conductivity type is deposited on the surface of a plate-shaped semiconductor body of the other conductivity type which is partly provided with at least one semiconductive layer of this one conductivity type, and into which surface layer subsequently to the application of respectively one diffusion masking with diffusion openings there is diffused at least one first insulating zone through an insulating-zone diffusion opening, at least one base zone through a base-zone diffusion opening, and at least one third zone through an emitter-diffusion opening, wherein the improvement comprises applying a first diffusion masking comprising all openings corresponding to the structures of a master mask, and modifying the openings of said master mask for use in subsequent masking steps.

According to the inventive method, it is of particular advantage to use masks, such as photoresist masks and photomasks for exposing photoresist layers which, just like the masking layers, contain exclusively partial structures of the master mask with the same dimensions or with dimensions uniformly modified over the edges of the master mask structure.

Accordingly, the basic idea of invention resides in the fact that prior to all such processes requiring high accuracy with respect to the assignment and the dimensions of the openings in an insulating layer used as a diffusion masking, diffusion masking is applied with all openings required for these processes of greater accuracy and in accordance with a master mask, from which master mask it is possible to produce the further masks or maskings respectively required for these processes, by merely uniformly enlarging or closing, or completely closing the openings of the master mask. These further masks or maskings respectively, with respect to the master mask — and consequently also the first diffusion masking — have small errors because they represent a particularly simple negative or positive modification of the master mask. There will then also result the advantage that the first diffusion masking corresponding to the master mask, can be used for all further planar diffusion processes of increased accuracy, in such a way that the openings not required for a planar diffusion process, can be closed by means of a further diffusion masking of smaller accuracy with respect to the first diffusion masking.

It is most advantageous to manufacture this further diffusion masking from a material which is easier to etch than the material of the first diffusion masking. Indications as to suitable pairs of material with corresponding etching agents can be found in the relevant literature. Relative thereto it is known that the alignment of masks to be successively deposited on a semiconductor surface, can be ensured or avoided by using a first diffusion masking which is capable of being etched by using a first but not a second etching agent, and by using a second diffusion masking which is capable of being etched by using a second but not the first etching agent. As suitable material for the diffusion maskings, there is used silicon dioxide which is capable of being etched by using an ammonium-chloride-buffered solution of hydrofluoric acid, and as a further material there is used silicon nitride which is attacked by ammonium hypophosphate.

Relative to the same matter and with respect to silicon dioxide and silicon nitride, reference is made to the "Journal of the Electrochemical Society" (August 1967), pp. 869 to 872. It is also possible, however, to use materials, such as doped glasses, which, by means of certain additives, are capable of being differently etched by counteracting certain other etching agents.

The method according to the invention is particularly favorable for effecting the low-ohmic contacting of the base zone of a planar transistor component by means of a base contact zone, because the latter, in manufacture, can be brought reproducibly into an extremely small spaced relation with the base zone. The width of the stem in the first diffusion masking, hence the spacing between the edges or rim portions of the base zone diffusion opening and of the base contact zone diffusion opening, may be chosen to be within the diffusion range of the dopings of both zones. This means to imply that the two zones, at least during the heat treatment following the base zone diffusion, diffuse into one another with the zones touching one another in a contacting manner.

BRIEF DESCRIPTION OF THE DRAWINGS

The above and other objects of the present invention will be better understood from the following detailed description taken in conjunction with the accompanying drawings, in which:

FIGS. 2', 3', 4' and 5', in modifying the type of embodiment explained with reference to FIGS. 1 to 8, relate to a second type of embodiment.

DESCRIPTION OF THE PREFERRED EMBODIMENT

Figure 7:
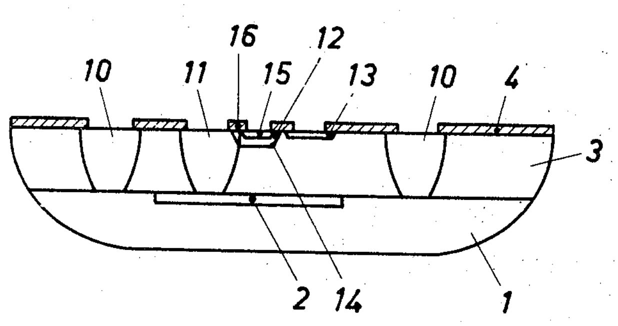
Figure 8:
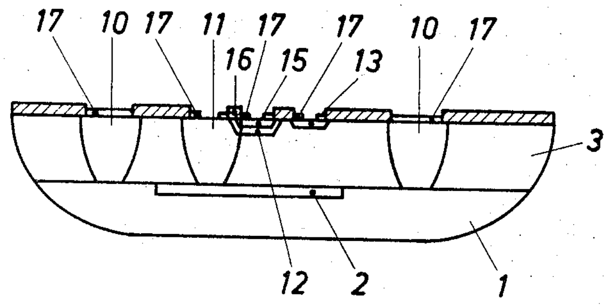

The first two examples of embodiment of the inventive method relate to the manufacture of a planar transistor component according to FIGS. 7 or 8 which is still to be contacted. For manufacturing this planar transistor component, there is diffused into a plate-shaped semiconductor body 1 of one conductivity type, into one surface side of a highly doped semiconductive layer 2 of the other conductivity type. To this semiconductor body 1 there is applied, preferably epitaxially, a semiconductive surface layer 3 of the other conductivity type. With respect to this semiconductive layer 2, care will have to be taken during manufacture of the planar transistor component, that it covers the base contact zone 11 which, however, is possible without placing any special demands on accuracy during alignment in the course of the first process for manufacturing the first diffusion masking 4, in relation to the position of the semiconductive layer 2. By specially dimensioning the doping concentration of the semiconductive layer 2 compared to the doping concentration of the semiconductor body 1, it is made possible to compensate for certain disadvantages in the diffusion of the base contact zone 11 simultaneously with the diffusion of the insulating zone 10, which will be explained in greater detail hereinafter.

The insulation zone 10 being of the same type of conductivity as the semiconductor body 1 surrounds the collector zone of the planar transistor component in a frame-like manner for effecting a separation with respect to direct current from the remaining semiconductor components of the monolithic integrated circuit.

In the examples of embodiment, and in a plate-like of laminar semiconductor body which, for example, is of p-conductivity, there is first of all produced the n-conducting semiconductive layer by employing the photolithographic process in combination with the planar diffusion method. To this body there is applied epitaxially an n-conducting surface layer of silicon having a thickness of 10 $\mu$m. Subsequently thereto, and in the course of a thermal oxidation process, there is produced an oxide layer having a thickness ranging from 0.5 to 1 $\mu$m.

Figure 1:
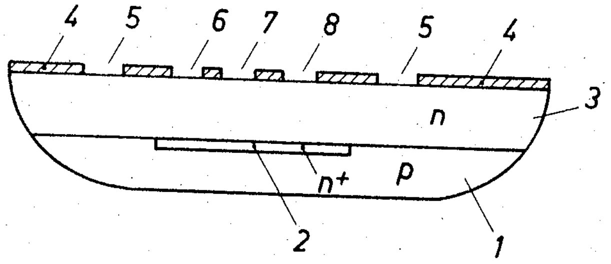
FIGS. 1 to 8 show cutaway cross-sectional views vertically in relation to the surface side of a conductor body, with respect to which there is explained a first type of embodiment of the invention for manufacturing a planar transistor component.

After this, and in accordance with the inventive method, there is deposited onto the semiconductor body 1 which is provided with the semiconductive surface layer 3 and the semiconductive layer 2, the first diffusion masking 4 comprising all of the openings corresponding to the master mask as shown in FIG. 1.

Accordingly, in this diffusion masking 4, there is provided a frame-like insulating zone diffusion opening 5, a base zone diffusion opening 7 which is preferably used at the same time as an emitter zone diffusion opening, and a base contact zone diffusion opening 6 within the diffusion range of the dopings extending to both the semiconductive layer 2 and the base zone to be diffused. In this way spaced relations and geometrical assignment of the openings in the first diffusion masking 4 are fixed in the course of one single process, for which purpose there is preferably used the generally known photolithographic method for producing etch maskings from a hardened photoresist. For exposing the photoresist layer, and quite depending on whether a positive or negative photoresist is being employed, there is used as a pattern either the master mask itself or the negative thereof.

If now there is to be achieved a particularly low collector lead resistance, there will have to be provided additionally in the first diffusion masking 4 the collector contact zone diffusion opening 8, because this opening is capable of being brought into the smallest safety spacing in relation to the base zone diffusion opening 7. The method according to the invention also enables, with respect to the collector lead resistance, to establish very low values, because very small spacings between the base zone 12 and the collector contacting zone 13 can be adhered to in a reproducible manner. For this reason, in FIG. 1, there is already provided in the first diffusion masking 4 the collector contact zone diffusion opening 8 serving the diffusion of a collector contacting zone 13 of the same conductivity type as that of the surface layer 3. The additional collector contact zone diffusion opening 8 can be produced in the first diffusion masking by having a spacing corresponding to less than the spacing of the semiconductive layer 2 from the pn-junction 14 between the base zone 12 and the base zone diffusion opening 7, which is still to be diffused.

Figure 2:
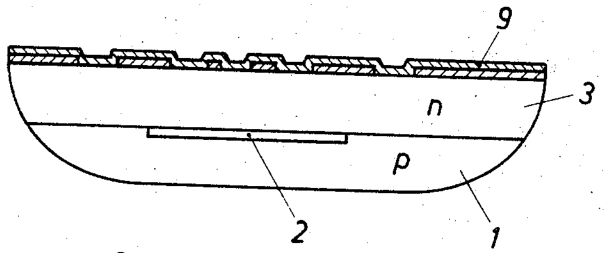
Figure 2:
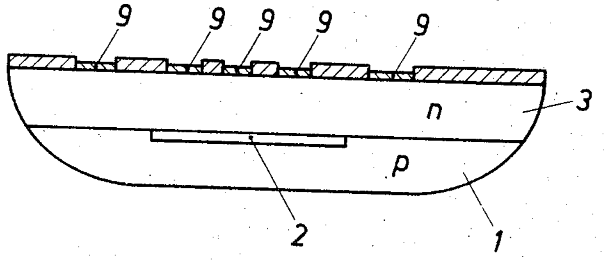
Figure 3:
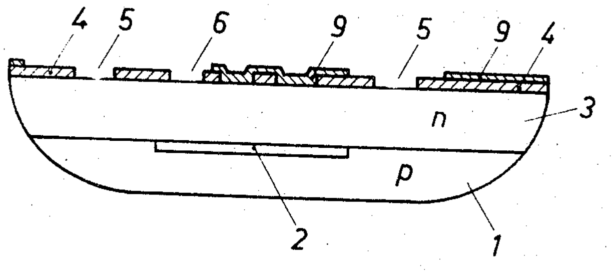
Figure 3:
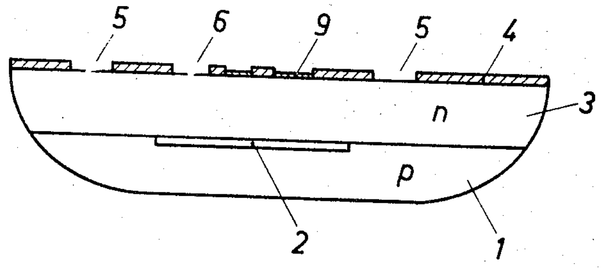
Figure 4:
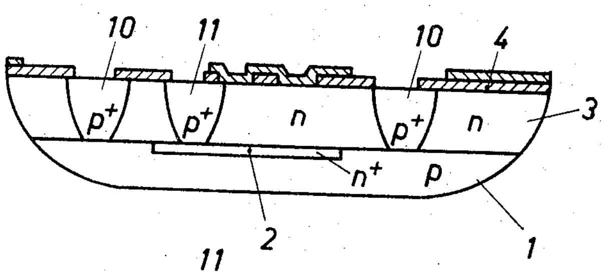
Figure 4:
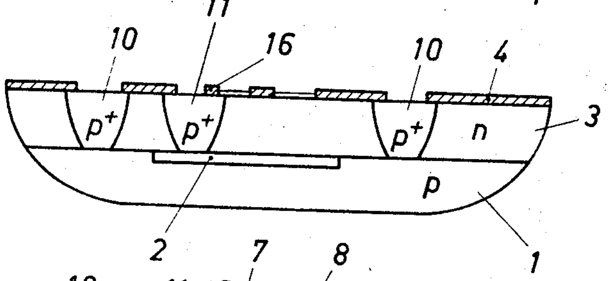

According to FIG. 2, all of the diffusion openings 5, 6, 7 and 8 are now closed in that, according to the first example of embodiment of the invention, a masking layer 9, preferably from a foreign oxide, and of a material which is easier to etch than the first diffusion masking 4, is deposited over the entire arrangement. Irrespectively of the already mentioned materials and etching agents, there may be deposited a first diffusion masking 4 of silicon oxide which, preferably on the free surface, is enriched with boron trioxide, and a second diffusion masking of a phosphorus-doped silicon oxide glass. The latter is produced from the foreign oxide layer 9 by way of an etching treatment in an etching solution with ammonium fluoride ($NH_4F$) containing hydrofluoric acid. For this purpose there is likewise used the well-known photolithographic method for effecting the etch masking which, however, requires no particular accuracy in the alignment of the photomask with respect to the first diffusion masking 4. In this way, upon removing the photoresist masking, and after a subsequent etching treatment in the etching solution with ammonium fluoride containing hydrofluoric acid, there is obtained a structure according to FIG. 3, in the course of which the openings 5 and 6 in the diffusion masking 4 as required for the first diffusion process, have been opened again. Finally, in the course of this second process following the first process of depositing the first diffusion masking 4, there are diffused both the insulating zone 10 and the base contact zone 1, as is illustrated in FIG. 4.

The masking required for manufacturing the etching mask of photoresist is produced from the master mask by completely closing the openings in the master mask corresponding to the openings 7 and 8 of the diffusion masking 4, and by uniformly enlarging the openings in the master mask corresponding to the openings 5 and 6 in the diffusion masking 4. This, however, is less in favor of the special accuracy not to be demanded at this point, and more in favor of the simple way of manufacturing the respective masking from the master mask.

In order to prevent the base contact zone 11 from meeting excessively upon the semiconductive layer 2 which would mean a reduction of the breakdown voltage between the base zone 12 and the collector zone of the planar transistor component, the doping concentration in the semiconductor body 1 is chosen to be relatively high. This makes it possible to employ reduced diffusion times, because the insulating zone 10 is already connected at an earlier stage than in the case of relatively low doping concentrations, by the dopings diffusing from the semiconductor body 1 into the surface layer 3. In the example of embodiment an antimony-doped semiconductive layer with a sheet resistivity of 10 –5 ohm/cm$^2$ and the semiconductor body 1 were doped with boron according to a specific resistance of 0,2 – 3,0 ohm cm.

Figure 5:
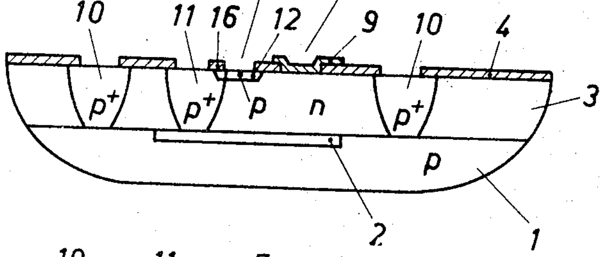
Figure 5:
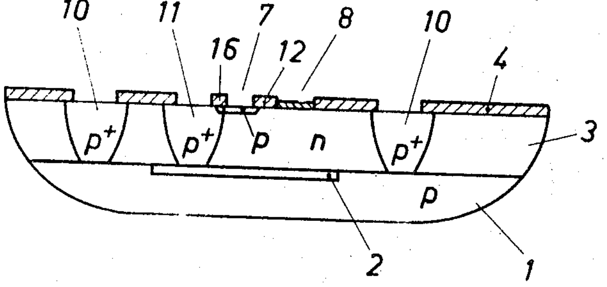

As a next step in the process, according to FIG. 5, the opening 8 in the diffusion masking 4 is again closed with a second diffusion masking which is easier to etch than the first diffusion masking 4. This is done in the same way as described hereinbefore with reference to FIGS. 2 and 3. For this purpose, however, there is used a photoresist masking which merely at the point of the opening 8 is provided with a structure (i.e., a photosensitive structure) uniformly enlarged over the edge of rim portions, and which is transparent to or permits the passage of ultra-violet light. The structures corresponding to the remaining openings, are closed completely. When depositing now a photoresist layer which hardens when subjected to ultra-violet radiation, and when subsequent exposure is effected through such a photoresist masking, and upon removal of the non-exposed photoresist by means of a suitable solvent at point 8, there will remain an etch masking covering the layer of material which is easier to etch than the first diffusion masking. Accordingly, upon applying a suitable etching agent and removing the remaining portions of the photoresist masking, there will remain the structure according to FIG. 5 with a closed opening 8. From this FIG. 5 it will also be seen that the steps of operation as described hereinbefore, i.e. for closing the opening 8, require substantially less accuracy of alignment with respect to the first diffusion masking 4, because this second diffusion masking 9 overlaps the first diffusion masking 4 at its rim portion. This overlapping may be chosen to be substantially greater than the allowances.

For effecting the low-resistance contacting of the base zone 12 to be diffused thereafter, the width of the masking stem 16 is to be so dimensioned that the sideway diffusion of the p-doping impurities will respectively reach the stem portion of the masking stem 16 lying beyond the diffusion front. In this case the spacing of the stem portions of both the base zone diffusion opening 7 and the base contact zone diffusion opening 6 is greater than the diffusion depth of the base zone 12.

As the result of the now following base zone diffusion, the base zone 12 is combined in a contacting manner with the base contact zone 11 below the masking stem 16. In cases where no particular low-resistive contacting is demanded, it should still be safeguarded that the base zone 12 combines with the base contact zone 11 at least during the temperature treatment of the semiconductor body following the base zone diffusion. This base zone diffusion may be carried out by using boron as the doping agent in an inert or slightly oxidizing or else also alternating inert-oxidizing atmosphere. It is suitable when applying the boron, not to produce any excessive boron glass occupancy in order to achieve an optimum maintenance of the masking layers. This diffusion can be carried out appropriately by using a defined oxidized boron nitride layer as the source of diffusion in an inert atmosphere, or else by using a boron halide in a nitorgen atmosphere by adding methanol vapor.

Figure 6:
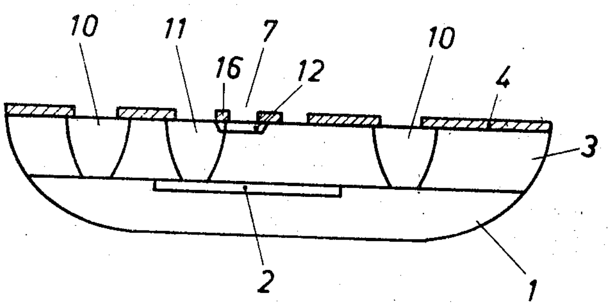

After this base zone diffusion and during the following fourth process, there is completely removed the remaining material 9 of the last-used diffusion masking with the aid of an etching treatment not attacking the first diffusion masking or attacking it substantially less than the material 9, and there is also carried out the emitter zone diffusion. In the course of this emitter zone diffusion, and together with the emitter zone 15, there is produced the collector contacting zone 13 according to FIG. 7, because during the preceding etching treatment there has also been opened the diffusion opening 8 in the first diffusion masking 4 as specially provided therefor, and as shown in FIG. 6. Removal of the material of the second diffusion masking 9 may be carried out by way of a simple dip etching.

When choosing for the emitter diffusion a smaller doping concentration, for example, of phosphorus atoms, than for the preceding diffusions of the p-conductive base contacting zone 11 and the insulating zone 10, the diffusion windows (openings) 5, 6 with 7 can remain open. However, in cases where there is used a higher doping concentration for the emitter diffusion than in the case of the preceding diffusions under p-doping impurities (boron), and for the purpose of avoiding a superficial redoping of the p-conductive zones, it is possible to cover the respective openings 5 and 6 completely, and 7 partly and slightly with a thermal-produced oxide.

If so required, and in cases where resistors are produced by being diffused simultaneously with the transistor component, a layer of foreign oxide is again deposited after the base zone diffusion for the purpose of avoiding the phosphorus diffusion. Thereafter the openings for the collector contact and emitter diffusion are opened and the emitter diffusion is made.

The emitter diffusion may be followed by a short normal thermal oxidation by forming an oxide film 17 according to FIG. 8. For producing the contact openings for the contacts of the base zone 12, the emitter zone 15 and the collector contact zone 13 now shown in the drawings, it is again possible to use the master mask as a pattern for serving as the photoresist mask for producing the photoresist etch masking. Therefore, if the master mask is available in the form of a negative of the first diffusion masking 4, i.e. having a structure not permitting the passage of ultra-violet light, corresponding to the openings of the first diffusion masking, then the masking structures corresponding to the openings 5 are completely omitted and in the case of an unintended contacting, the mask structures corresponding to the openings 6, 7 and 8 are constricted uniformly. By means of a photoresist masking designed in this way it is then possible, after alignment on a photoresist layer hardening upon ultraviolet radiation, to manufacture the photoresist etch masking for the etching of the thermally grown layers 17 over the zones to be contacted. Thereupon, the emitter zones, the base zones and the collector zones are contacted in cases where the semiconductor component according to FIG. 8 is intended to be used as a bipolar transistor.

Such a semiconductor component according to FIG. 8, of course, may also be used as a diode, in which case one contact is omitted.

In the second type of embodiment according to FIGS. 2', 3', 4' and 5', and in distinction to the steps of the first example of embodiment explained with reference to FIGS. 2, 3, 4 and 5 — employing the second diffusion masking 9 overlapping the first diffusion masking 4 — there are produced the second diffusion maskings within the openings provided in the first diffusion masking 4. In this second type of embodiment, there are used exclusively second diffusion maskings which are capable of being produced by way of reaction of the freely exposed semiconductive material with a suitable reactive gas phase by forming a connection or compound of the semiconductive material with one component of the gas phase, which is suitable as a masking. First of all, when using a silicon semiconductor body, it is possible to use silicon nitride and silicon dioxide as the materials for the second diffusion masking.

However, dopings can be brought into the silicon oxide as well as into the silicon nitride, preferably during the reaction with the gas phase, thus permitting the diffusion maskings to become differently etchable with respect to certain etching agents. One suitable combination resides in that there is deposited a first diffusion masking 4 of a boron-doped silicon oxide and a second diffusion masking of phosphorus-doped silicon oxide, and in that an etching treatment is carried out in an etching solution with ammonium fluoride containing hydrofluoric acid.

By using such methods for manufacturing a second diffusion masking 9 from a suitable combination with the material of the surface layer 3, first of all, and in accordance with FIG. 2', all openings in the first diffusion masking 4 are closed by a second diffusion masking which is easier or quicker to etch than the first diffusion masking 4, of which the openings 5 and 6, by employing a photolithographic process and a suitable etching solution, are reopened again. Subsequently thereto, there are diffused the insulating zone 10 and the base contact zone 11 by forming a structure according to FIG. 4'. During the now following third process the base diffusion opening 7 is opened additionally, and there is carried out a p-doping diffusion according to FIG. 5'. The opening of this base diffusion opening 7 is effected in the same way as in the mode of operation described with reference to FIGS. 2' and 3', i.e., by closing all of the openings and opening these openings with the exception of the opening 8 by employing the photolithographic process. In the course of this third process in which there is opened the base diffusion opening 7, there exist the same geometrical conditions as in the first example of embodiment, so that the base zone is to be diffused to such an extent as to contact the base contact zone at least during the following temperature treatment to which the semiconductor is subjected.

During the following fourth process the emitter diffusion, upon removing the second diffusion masking with the aid of an etching agent attacking the first diffusion masking not at all or substantially slighter than the second diffusion masking 9, so that there will be obtained again a structure according to FIG. 6. The further steps of operation correspond to those described with reference to the first example of embodiment.

Figure 9:
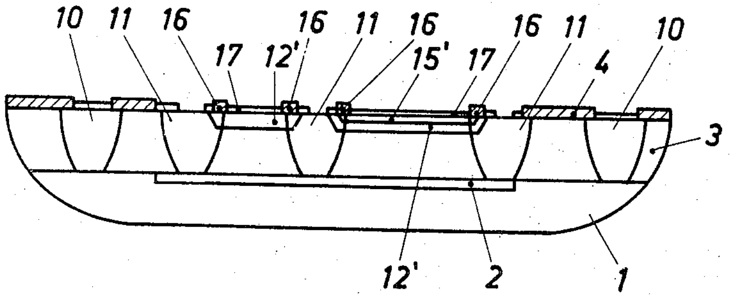
FIG. 9 relates to the manufacture of an ohmic (resistive) voltage-dividing component in a monolithic integrated circuit according to the inventive method.

FIG. 9 refers to a sectionally shown ohmic voltage divider component of a monolithic integrated circuit represented in a cross-sectional view vertically in relation to the surface side of a semiconductor body, which is likewise manufactured by way of planar diffusion into the monocrystalline surface layer 3 on the semiconductor body 1, and which is surrounded in a frame-like manner by the insulating zone 10. Here, too, the surface layer 3 is deposited on the plate-like semiconductor body 1 provided with the semiconductive layer 2. The zone used as the voltage divider, comprises the contacting zones 11 and the partial zones 12' to be contacted. The latter partial zones correspond to the base zone 12 of the planar transistor component according to FIG. 8, because they are manufactured simultaneously with the base zones 12 of the planar transistor components still belonging to the same monolithic integrated solid-state circuit. One such partial zone 12', therefore, is likewise referred to as a base zone.

In connection with the manufacture of monolithic integrated circuits comprising diffused resistors or voltage dividers according to FIG. 9, there likewise arises the aforementioned problem of providing smallest safety spacings. In addition thereto, diffused resistors or voltage dividers of monolithic integrated circuits are supposed to have as small as possible tolerances as regards the resistors and, consequently, as regards the dimensions and arrangements of the partial zones. Likewise, it is desirable to provide a possibility of manufacturing very small dimensions in such a reproducible manner as to obtain higher resistance values also in cases of small available surface areas. As is well known, higher resistance values can also be obtained in that the current path of the resistor as given by the partial zone 12′, is constricted by a squeezing zone 15′ having the same conductivity as the surface layer 3. This squeezing zone 15′ is generally manufactured together with the emitter zone 15 of a planar transistor component according to FIG. 8 still belonging to the monolithic integrated solid-state circuit. But also on this squeezing zone 15′ there are placed the same requirements with respect to dimensions and spacings (spaced relations) as in the case of the contacting zones 11 and the base zones 12′. Accordingly, the inventive method can be applied equally well and in an advantageous manner to the manufacture of diffused resistors according to FIG. 9.

The different etchability of the diffusion maskings can also still be influenced by correspondingly selecting the thickness ratio. Therefore, it is within the scope of the invention to use also thicker diffusion maskings in cases where a lower degree of etchability is required, and to apply thinner diffusion maskings whenever a more rapid etching is demanded.

When adopting the teaching of the invention there will first have to be designed a master mask, with the structure thereof corresponding to the first diffusion masking as deposited in the course of the first process. This first diffusion masking has to have all openings for all diffusion processes, but at least for such diffusion processes in which the allowances have to be reduced to a minimum, where the yield is to be increased, or else in cases where the dimensions of a semiconductor component are to be diminished. From this master mask there are then produced the remaining masks or maskings either in accordance with the master mask or in accordance with the negative thereof, in which case it will have to be considered whether there is used a negative photoresist or a positive photoresist. From this master mask, there are manufactured all further masks or maskings for the processes following the first diffusion process, and which masks can be manufactured with a high accuracy from the master mask alone by way of uniformly enlarging or constricting or completely omitting the structures of the first master mask, corresponding to the individual openings of the first diffusion maskings. This is possible because the first diffusion masking and, consequently, the master mask, already contains all structures for all of the high-accuracy processes. The uniform enlargement or constriction of the structures of the master mask for producing a further mask offers the advantage that said further mask can be aligned more exactly and more easily to the already produced structures, in that the structure of the mask can be brought to a uniform all-round spaced relation to the first diffusion masking 4 as already existing on the semiconductor wafer. This particularly affects the photoresist maskings for producing contact openings and the photoresist etch maskings required for the etching of the diffusion openings in the first diffusion masking 4. These, however, are processes on which no particularly high requirements are placed as regards accuracy, because these processes have no influence upon the dimensions, spaced relations and assignments of the zones which are determinative of the electrical properties of the semiconductor component or the monolithic integrated solid-state circuit to be manufactured respectively.

The main advantage of the inventive method, however, results from the fact that a first diffusion masking 4 is deposited in the course of a first process, which already contains all openings for carrying out the planar diffusion for such zones whose dimensions, spaced relations and assignments in relation to one another are to be exactly adhered to. These high-accuracy planar diffusion processes are carried out by using the same diffusion masking 4 whose structure is fixed in the course of one single photolithographic process. Since, accordingly, there is omitted a repeated adjustment of photoresist maskings for producing further diffusion masks, closest spacings are possible because of permitting very small allowances without sacrificing the yield. Accordingly, the inventive method is thus to be classified among the so-called "self-aligning" diffusion methods.

The allowances can be reduced to about one fourth or one fifth of the allowances customary in the known methods. Therefore, without sacrificing any yield, individual components can be manufactured which only occupy one fourth to one fifth of the semiconductor surface compared to the hitherto required semiconductor surface. Accordingly, monolithic integrated solid-state circuits are capable of being manufactured having dimensions amounting to a fraction of the hitherto realizable ones. In the case of diffused resistors, the values can be adhered to most exactly which, in the case of voltage dividers, makes it possible to adhere very exactly to the divider ratio. Once a first diffusion masking 4 has been produced with greatest perfection, i.e., possibly free from holes and cracks, this perfection not only remains to exist, but is even improved because any possibly still existing errors or impurities are likely to heal in the course of the following temperature treatments or processes. Accordingly, the errors or impurities occurring during manufacture of the second diffusion masking, do not propagate into the first diffusion masking, and can thus also not impair the electrical properties and the yield. Irrespectively of the expected increased yield due to the elimination of aligning errors there is even to be expected a further increase in yield by the elimination of such masking or aligning errors propagating into the first diffusion masking.

It is to be understood that the foregoing description is made by way of example only and is not to be considered as a limitation on its scope.

I claim:

1. A method for the planar diffusion of zones of a monolithic integrated circuit comprising:

depositing on the surface layer of a plate-like semiconductor body a first diffusion masking containing an insulating zone diffusion opening, a base zone diffusion opening, a third zone diffusion opening and a base contact zone diffusion opening;

closing said base zone diffusion opening and said third zone diffusion opening with a second diffusion masking which is easier to etch than said first diffusion masking and diffusing said insulating zone and said base contact zone;

opening said base zone diffusion opening;

diffusing said base zone to such an extent that said base zone contacts said base contact zone;

removing said second diffusion masking; and diffusing an emitter zone.

2. A method according to claim 1, further comprising the step of producing an additional collector contact zone diffusion opening for diffusing a collector contacting zone of the same conductivity as said surface layer.

3. A method according to claim 2, wherein said additional collector contact zone diffusion opening is produced at a spaced relation less than the spacing of said semiconductive layer, between said base zone and said base zone diffusion opening in said first diffusion masking.

4. A method according to claim 3, wherein the spacing between the edges of said base zone diffusion opening and said base contact zone diffusion opening is greater than the diffusion depth of said base zone.

* * * * *